(12) United States Patent
Chandrasekhar

(10) Patent No.: US 8,134,868 B2
(45) Date of Patent: Mar. 13, 2012

(54) MEMORY DEVICE BIASING METHOD AND APPARATUS

(75) Inventor: Uday Chandrasekhar, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 498 days.

(21) Appl. No.: 12/265,989

(22) Filed: Nov. 6, 2008

(65) Prior Publication Data

US 2010/0110789 A1     May 6, 2010

(51) Int. Cl.
*G11C 11/34* (2006.01)
(52) U.S. Cl. .......... 365/185.03; 365/185.18; 365/185.17
(58) Field of Classification Search ............. 365/185.03, 365/185.18, 185.17, 189.07, 185.12, 185.19, 365/185.28, 236
See application file for complete search history.

(56) References Cited

U.S. PATENT DOCUMENTS

| 6,845,042 B2 * | 1/2005 | Ichige et al. | 365/185.17 |
| 2006/0256620 A1 * | 11/2006 | Nguyen et al. | 365/185.28 |
| 2007/0159886 A1 * | 7/2007 | Kang | 365/185.17 |
| 2007/0263462 A1 * | 11/2007 | Roohparvar | 365/198 |

* cited by examiner

*Primary Examiner* — Dang Nguyen
(74) *Attorney, Agent, or Firm* — Leffert Jay & Polglaze, P.A.

(57) ABSTRACT

Memory devices and methods are disclosed, such as those facilitating data line shielding by way of capacitive coupling with data lines coupled to a memory string source line. For example, alternating data lines are sensed while adjacent data lines are coupled to a common source line of the data lines being sensed. Data line shielding methods and apparatus disclosed can reduce effects of source line bounce occurring during a sense operation of a memory device.

26 Claims, 9 Drawing Sheets

US 8,134,868 B2

1

MEMORY DEVICE BIASING METHOD AND APPARATUS

TECHNICAL FIELD

The present disclosure relates generally to semiconductor memory devices and more particularly, in one or more embodiments, to biasing methods in non-volatile memory devices.

BACKGROUND

Flash memory devices have developed into a popular source of non-volatile memory for a wide range of electronic applications. Flash memory devices typically use a one-transistor memory cell (e.g., floating gate) that allows for high memory densities, high reliability, and low power consumption. Changes in threshold voltage of the cells, through programming of charge storage nodes (e.g., floating gates or trapping layers) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

Flash memory typically utilizes one of two basic architectures known as NOR Flash and NAND Flash. The designation is derived from the logic used to read the devices. FIG. 1 illustrates a NAND type flash memory array architecture 100 wherein the floating gate memory cells 102 of the memory array are arranged in a logical matrix of rows and columns. The memory cells 102 of the array are also arranged together in strings (e.g., NAND strings), typically of 8, 16, 32, or more each, where the memory cells in a string are connected together in series, source to drain, between a source line 128 and a data line 130, often referred to as a bit line. The array is then accessed by a row decoder activating a logical row of floating gate memory cells by selecting a particular access line, often referred to as a word line WL7-WL0 $112_8$-$112_1$, connected to their control gates. As is known to those skilled in the art, the number of word lines and bit lines might be much greater than those shown in FIG. 1.

In addition, bit lines BL0-BL3 $130_1$-$130_4$ can also be driven high or low depending on the operation being performed. For example, during a typical read operation, even numbered bit lines BL0 $130_1$ and BL2 $130_3$, are pre-charged by sense devices $138_1$ and $138_3$, respectively, to a particular bias level. Odd numbered bit lines BL1 $130_2$ and BL3 $130_4$ are driven low to a common ground connection GND 146, such as through gates $156_1$ and $156_2$. In a subsequent read operation, even numbered bit lines may be driven to GND 146 while odd numbered bit lines are read. The bit line select gates $156_1$-$156_2$, $160_1$-$160_2$ thereby allow for either the even or odd bit lines to be coupled to a common ground potential node, GND 146. Select gates 156/160, are typically large, high voltage devices which are located outside of the array. By coupling every other bit line (e.g., alternate bit lines) to GND 146 during a read operation, the grounded bit lines serve as a shield (e.g., through capacitive coupling) between to the two adjacent strings (e.g., precharged bit lines) of memory cells being read, such as $164_1$ and $164_3$, for example.

Bit lines BL0-BL3 $130_1$-$130_4$ are coupled to sensing devices (e.g., sense amplifiers) $138_1$-$138_4$ that detect the state of each cell by sensing voltage on a particular bit line $130_1$-$130_4$. Word lines WL7-WL0 $112_8$-$112_1$ select the individual

2 memory cells (e.g., $164_1$-$164_4$) in the series strings to be written to, verified or read from and operate the remaining memory cells in each series string in a pass through mode. Each series string of memory cells is coupled to a source line 128 by a source select gate 106 and to an individual bit line BL0 $130_1$ by a drain select gate 104, for example. The source select gates, such as 106, are controlled by a source select gate control line SG(S) 110 coupled to their control gates. The drain select gates, such as 104, are controlled by a drain select gate control line SG(D) 108.

Memory cells 102 can be what are known in the art as Single Level Memory Cells (SLC) or Multilevel Memory Cells (MLC). SLC and MLC memory cells are assigned a data state (e.g., as represented by one or more bits) to a specific range of threshold voltages (Vt) stored on the memory cell. Single level memory cells (SLC) permit the storage of a single binary digit (e.g., bit) of data on each memory cell. Meanwhile, MLC technology permits the storage of two or more binary digits per cell (e.g., 2, 4, 8, 16 bits), depending on the quantity of Vt ranges assigned to the cell and the stability of the assigned Vt ranges during the lifetime operation of the memory cell. The number of Vt ranges (e.g., levels), used to represent a bit pattern comprised of N-bits is $2^N$, where N is an integer. For example, one bit may be represented by two levels, two bits by four levels, three bits by eight levels, etc. Some memory cells can store fractional numbers of bits, such as 1.5 bits per cell (e.g., MLC(three level)). A common naming convention is to refer to SLC memory as MLC(two level) memory as SLC memory utilizes two Vt ranges in order to store one bit of data as represented by a 0 or a 1, for example. MLC memory configured to store two bits of data can be represented by MLC(four level), three bits of data by MLC(eight level), etc.

FIG. 2 illustrates an example of Vt ranges 200 for a MLC (four-level) (e.g., 2-bit) memory cell. For example, a cell may be assigned a Vt that falls within one of four different Vt ranges 202-208 of 200 mV, each being used to represent a data state corresponding to a bit pattern comprised of two bits. As one example, if the voltage stored on the cell is within the first of the four Vt ranges 202, the cell in this case is storing a logical '11' state and is typically considered the erased state of the cell. If the voltage is within the second of the four Vt ranges 204, the cell in this case is storing a logical '10' state. A voltage in the third Vt range 206 of the four Vt ranges would indicate that the cell in this case is storing a logical '00' state. Finally, a Vt residing in the fourth Vt range 208 indicates that a logical '01' state is stored in the cell.

Referring again to FIG. 1, during a typical read operation of the memory array 100, NAND strings of memory cells coupled to even numbered bit lines (e.g., $130_1$, $130_3$) are read, followed by a read operation of the NAND strings coupled to odd numbered bit lines (e.g., $130_2$, $130_4$.) During a read operation, bit lines to be read (e.g., not grounded to GND 146) are precharged to a particular bias level, such as 0.5V, for example. A read operation may be performed of memory cells $164_1$-$164_4$ of the row (e.g., word line) WL4 $112_5$, for example. As the read operation is performed, the bit line being read can be discharged into the SRC line 128. As a result, the SRC line 128 may experience what is referred to as source line bounce wherein the bias level of the source line rises in response to the bit lines being discharged into the SRC line 128. This source line bounce can thereby introduce errors during a read operation of the memory.

For the reasons stated above, and for other reasons which will become apparent to those skilled in the art upon reading and understanding the present specification, there is a need in the art to reduce the effects of source line bounce while sensing memory cells in a memory device.

DETAILED DESCRIPTION

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Figure 1:
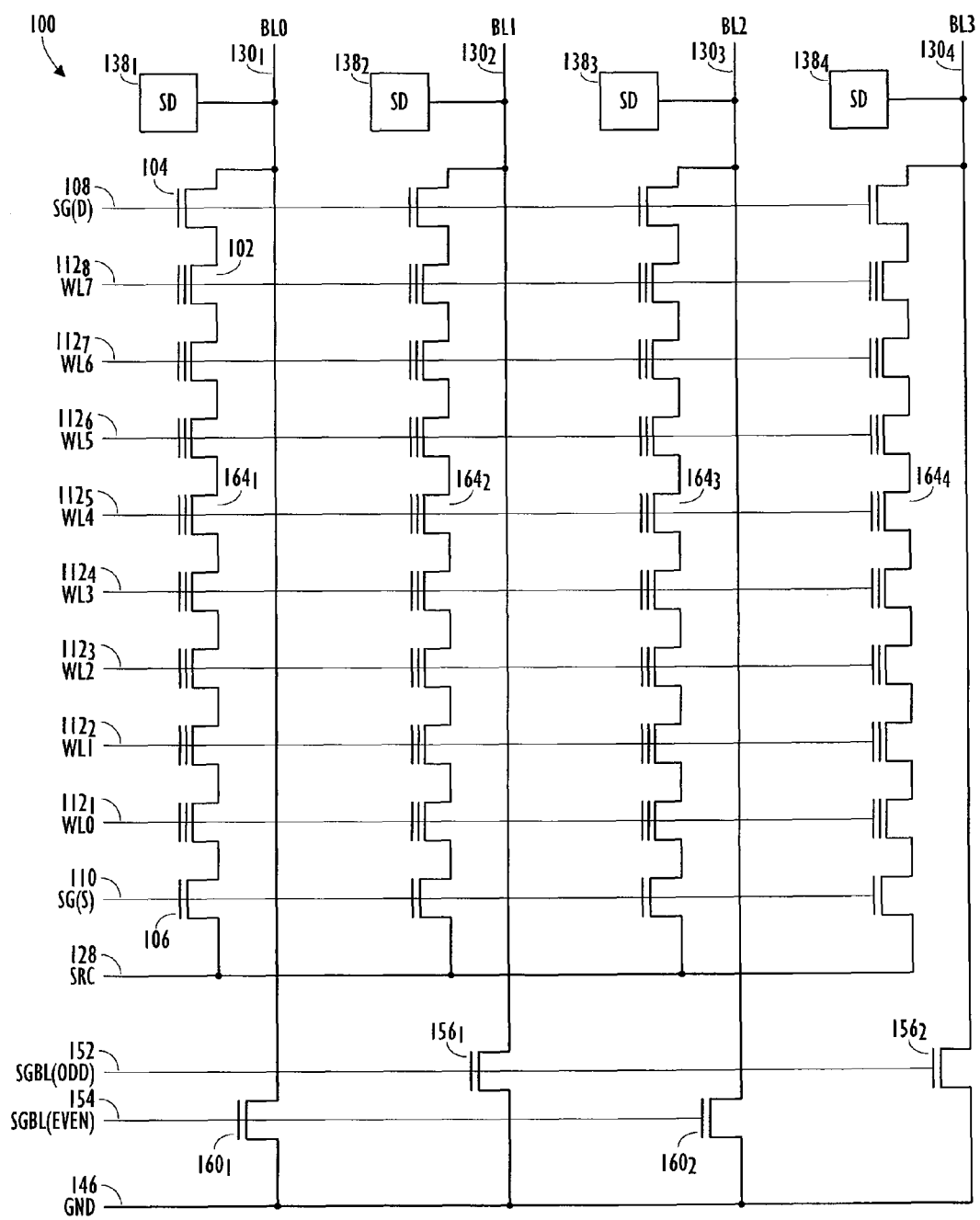
FIG. 1 shows a typical arrangement of multiple series strings of memory cells of a memory array organized in a NAND architecture.
Figure 2:
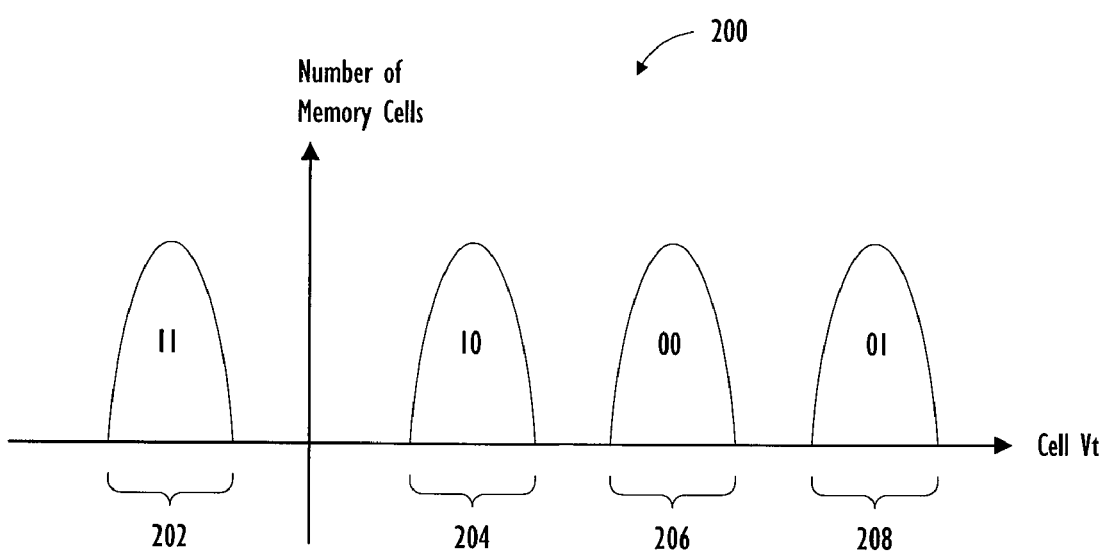
FIG. 2 shows a graphical representation of threshold voltage ranges in a memory cell.
Figure 3:
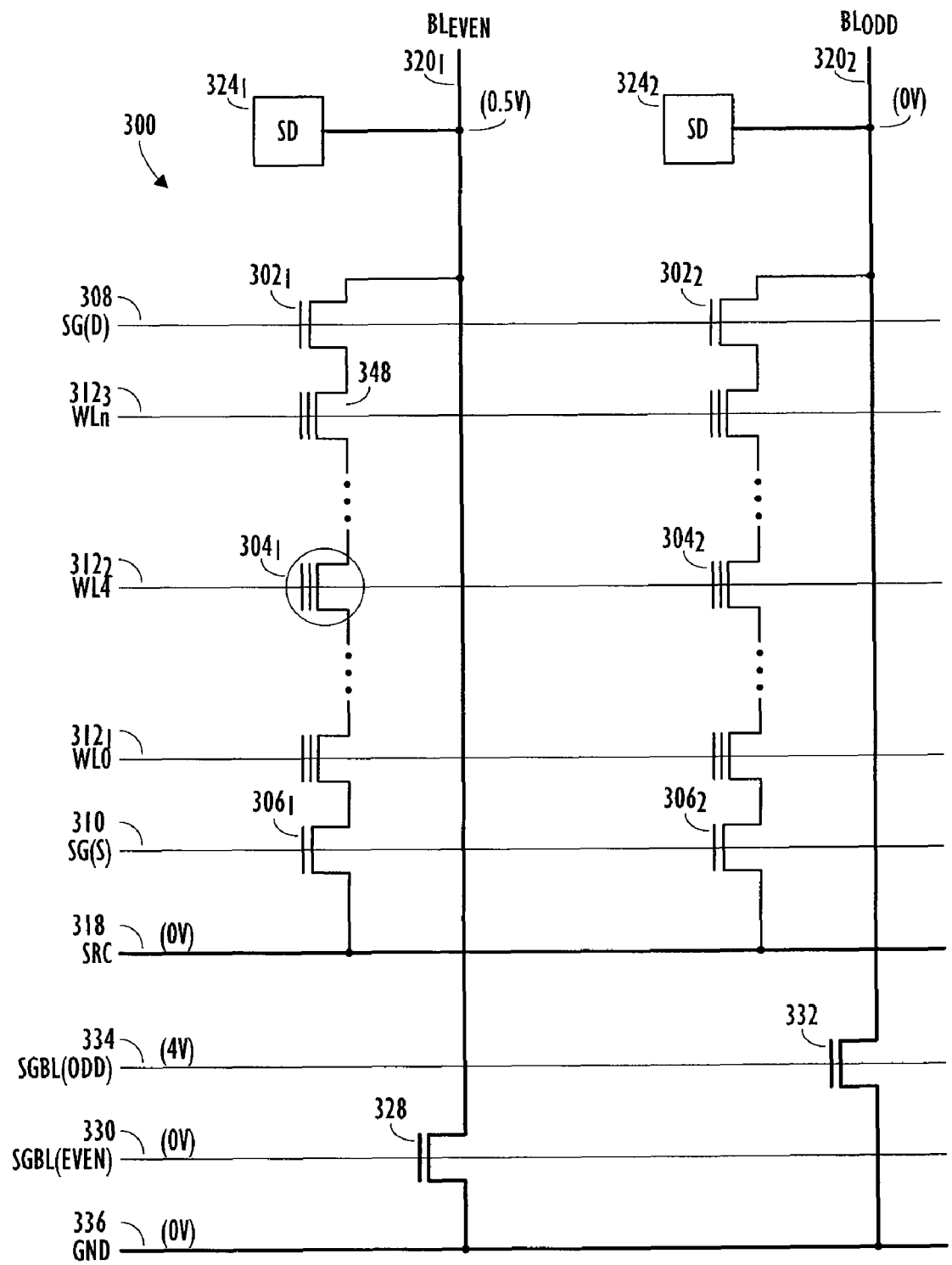
FIG. 3 shows a typical arrangement of two series strings of memory cells of a memory array organized in a NAND architecture.

FIG. 3 shows a typical array of memory cells 300 arranged in a NAND configuration similar to that shown in FIG. 1. FIG. 3 illustrates a single typical odd numbered and even numbered string of memory cells thereby simplifying and improving readability of the Figure. FIG. 3 also illustrates an example of initial biasing conditions for performing a read operation of the memory array 300.

During a typical sensing operation (e.g., a read or verify operation) of the array 300, either the even numbered bit lines, such as $320_1$, or the odd numbered bit lines, such as $320_2$ are selected as part of the sense operation. Although reference to a read operation is made with respect to FIG. 3, the discussion would apply similarly to a verify operation performed on the memory array 300 as well as a verify operation is also a method of reading a memory cell. In order to perform a read operation on memory cell $304_1$ for example, select gate 328 is disabled by biasing signal SGBL(EVEN) at 0V 330. The adjacent odd numbered bit line $320_2$ is coupled to the GND 336 signal by driving the SGBL(ODD) signal 334 such that the select gate 332 is activated, such as to 4V, for example. This effectively couples the odd numbered bit lines adjacent to the even numbered bit lines (e.g., selected bit lines) to GND 336. The GND line 336 typically has a low voltage present, such as 0V, for example. Thus, because the odd numbered bit lines are driven to the bias level of GND 336, the odd numbered bit lines $320_2$ act as shielding while even numbered bit lines $320_1$ are being read. In a subsequent read operation, the roles of the odd numbered and even numbered bit lines are reversed. For example, the even numbered bit lines $320_1$ are coupled to the GND signal 336 to act as shields for odd numbered bit lines when odd numbered bit lines $320_2$ are selected for a read operation.

In a read operation of even numbered bit lines $320_1$, the even bit lines are biased (e.g., pre-charged) to a particular bias level. For example, bit line $320_1$ might initially be biased to a level of 0.5V, for example. Odd numbered bit lines $320_2$ are biased at the bias level of the GND signal 336 through the enabled 332 select gate. For example, 0V as shown on GND 336 shown in FIG. 3. This is further indicated by a 0V bias shown on odd bit line $320_2$.

The circle surrounding memory cell $304_1$ indicates that it is a memory cell targeted for a read operation. Although not shown in the Figure, other memory cells of the array 300 coupled to row $312_2$ (e.g., WL4) and coupled to additional even bit lines (not shown) would also be targeted to be read along with memory cell $304_1$. During the read operation, rows not comprising memory cells to be read (e.g., $312_1$, $312_3$) are biased at a bias level (e.g., Vpass) that renders the unselected memory cells (e.g., 348) in a pass through mode. Drain select gates 302 (coupled to data lines 320) and source select gates 306 (coupled to source 318) are also enabled to allow current to flow through each selected NAND string. Thus, the flow of current in a selected NAND string during a read operation is dependent on the data state (e.g., Vt level) of the target memory cell, such as $304_1$ of FIG. 3. That is, during the read operation, the target memory cell $304_1$ will be selectively activated in response to its data state.

Figure 4:
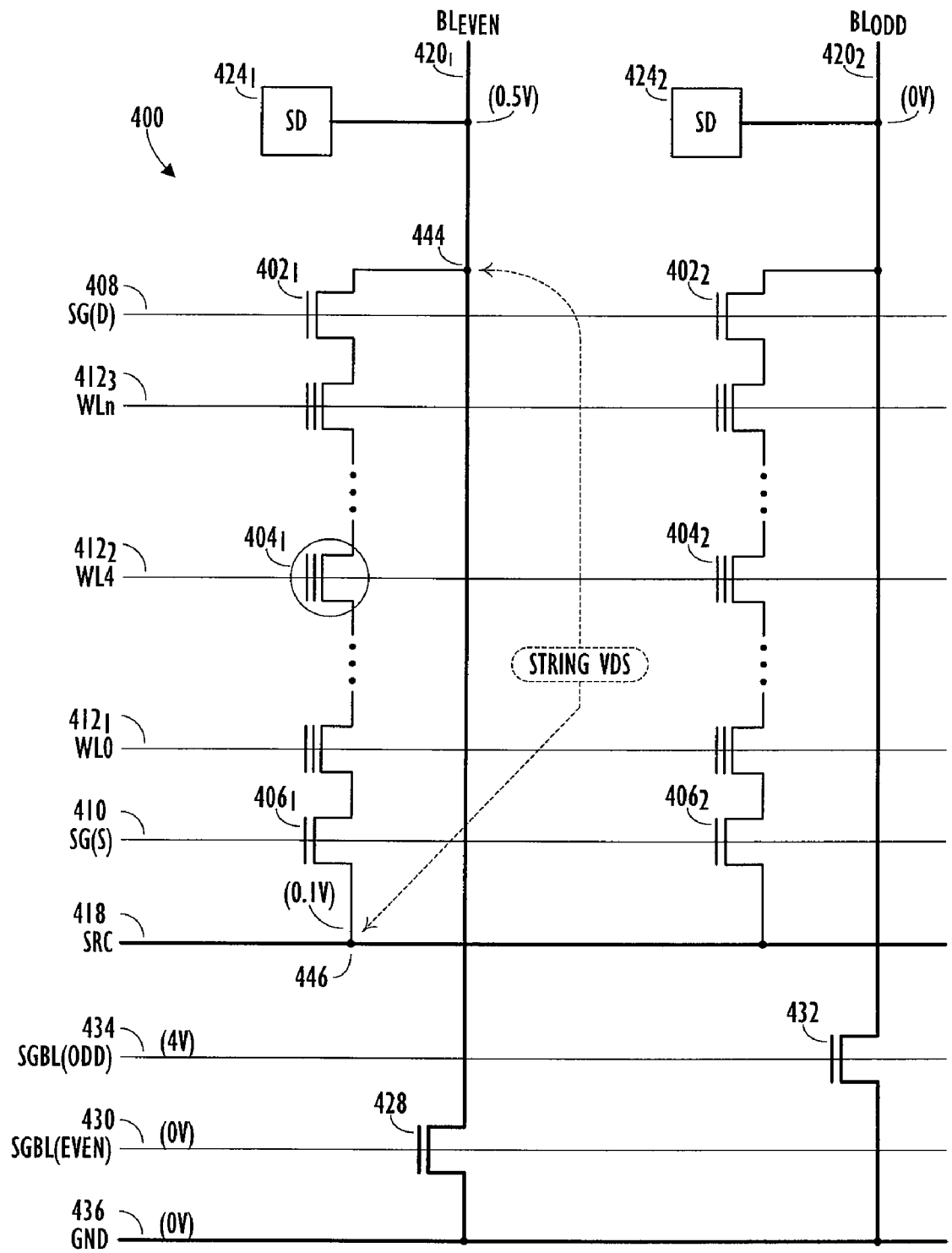
FIG. 4 shows a typical arrangement of two series strings of memory cells of an array organized in a NAND architecture.

FIG. 4 illustrates the same array of memory cells as 300. However, FIG. 4 illustrates different biasing conditions in the array as a result of performing a read operation on the array 400.

One source of error during a read operation can occur as a result of a transient condition often referred to as source line bounce. Source line bounce occurs as the pre-charged bit line is discharged into the source line. Because the source line 418 has a finite resistance, current flowing into it causes the potential of the source line to increase, as indicated by the bias level of 0.1V as shown on SRC 418 of FIG. 4. This in effect reduces voltage across the NAND string being read (e.g., across the drain side of the NAND string 444 to the source side of the NAND string 446), sometimes referred to in the art as string VDS. String VDS typically refers to the voltage present across the NAND string of memory cells including the voltage across the drain select gate 402 and the source select gate 406. This has the overall effect of changing the read potential on the pre-charged bit line discussed above which in one example is 0.5V. The 0.1V of source line bounce as shown in FIG. 4 results in an effective read voltage across the string (e.g., string VDS) of the even bit line $420_1$ to no longer be the original pre-charge bias of 0.5V but instead is now 0.4V (e.g., 0.5V−0.1V), for example. This can introduce read errors during a read operation of the memory device.

In addition, the source line bounce can vary depending on the data state of each memory cell being read. For example, one NAND string of memory cells being read might experience more source line bounce than another NAND string of memory cells being read during the same read operation. This occurs as each NAND string can have different magnitudes of current flow through them which is at least partially dependent on the data state of each memory cell of a selected row. This results in a different level (e.g., magnitude) of source line bounce present at the source side of each source select gate 406 of each NAND string being read. Source line bounce can also occur locally with respect to the source side connection of a given NAND string to the SRC line. For example, one memory cell of a selected row of memory cells might be programmed whereas another memory cell of the same row may not be programmed (e.g., erased state). A programmed memory cell is going to conduct a different amount of current through its NAND string then the un-programmed (e.g., erased) memory cell is going to conduct through its NAND string. This results in the programmed memory cell being read at a different read voltage than the un-programmed memory cell will be read at due to the source line bounce occurring near the NAND string of the un-programmed memory cell. Although source line bounce was discussed above with respect to a read operation of even numbered bit lines $420_1$, the same effects apply in the case of reading odd numbered bit lines $420_2$ undergoing a read (or verify) operation.

Figure 5:
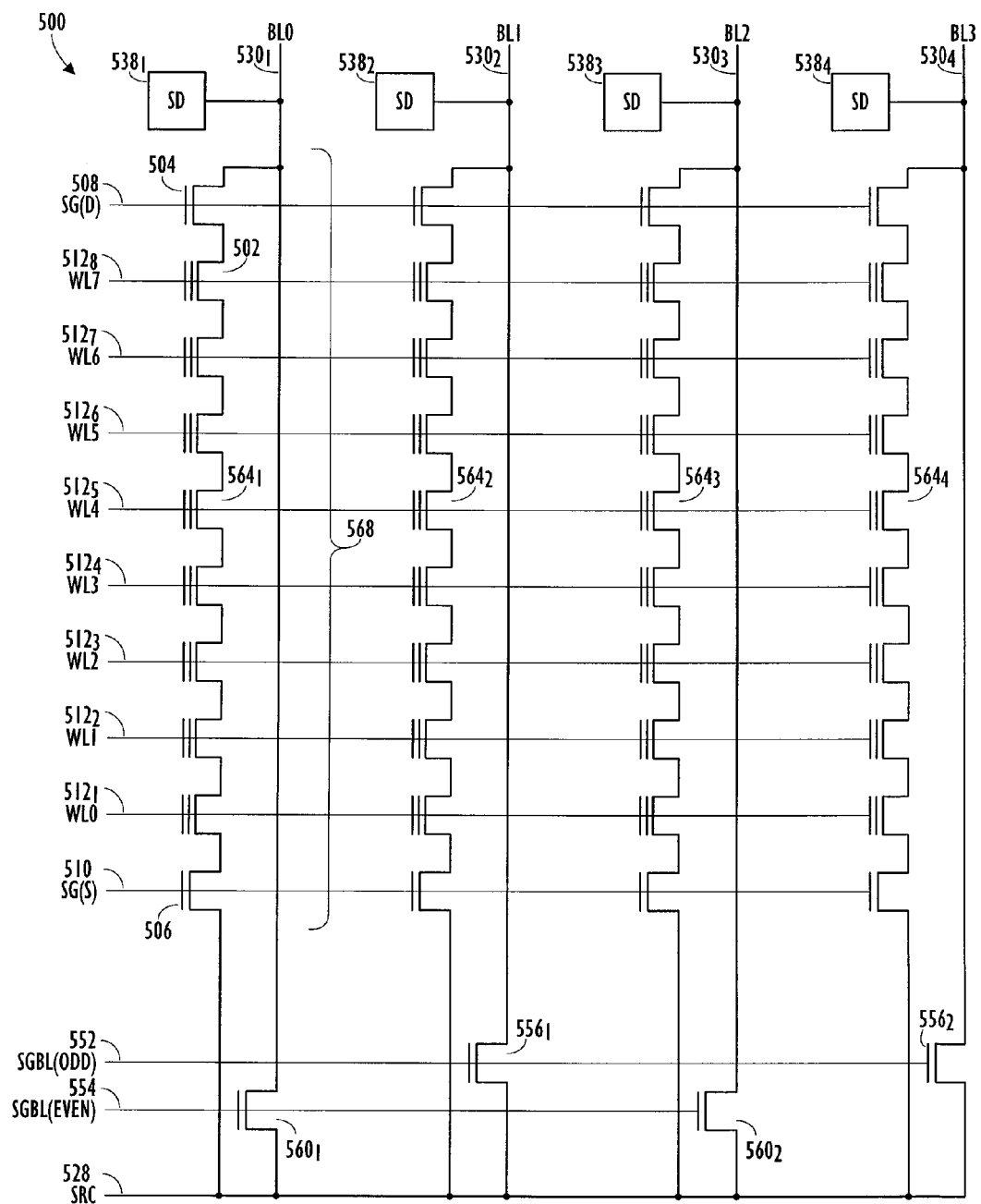
FIG. 5 shows an array of memory cells according to an embodiment of the present disclosure.

FIG. 5 illustrates an array 500 of memory cells 502 according to an embodiment of the present disclosure which should reduce the effect of source line bounce as discussed with respect to FIGS. 3 and 4. FIG. 5 illustrates an array of memory cells 500 arranged in a number of NAND configured strings 568 each coupled to a respective bit line BL0-BL3 $530_1$-$530_4$. Each string of memory cells 568 comprises a drain select gate 504, a string of memory cells 502 each having a control gate coupled to a word line $512_8$-$512_1$ and a source select gate 506. Each bit line BL0-BL3 $530_1$-$530_4$ is coupled to a sense device $538_1$-$538_4$ as are known to those skilled in the art. FIG. 5 also shows additional select gates $556_1$-$556_2$, $560_1$-$560_2$ which allow for reading even numbered bit lines during a first read operation and reading odd numbered bit lines during a second read operation, for example. Select gates $556_1$-$556_2$ are controlled by the SGBL(ODD) signal 552. Select gates $560_1$-$560_2$ are controlled by the SGBL(EVEN) signal 554. Although shown in FIG. 5 as single select gates, each select gate $556_1$-$556_2$, $560_1$-$560_2$ can be comprised of multiple gates such as two or more gates coupled in series and/or parallel configurations according to various embodiments of the present disclosure. For example, select gate $556_1$ might be comprised of two or more gates coupled in series.

It should be noted that according to one or more embodiments, the odd/even bit line select gates $556_1$-$556_2$, $560_1$-$560_2$ couple the bit lines BL0-BL3 $530_1$-$530_4$ not to the GND signal as is shown in FIGS. 1, 3 and 4, but instead couple the bit lines to the SRC line 528. It should be noted further that the SRC line 528 is located inside the memory cell array of the device and is not directly coupled to nor is it equivalent to the GND signal and/or a Vss input pin of the integrated circuit device (e.g., chip), for example. The SRC line 528 might be biased to a particular bias level under a number of array biasing scenarios independent of the GND signal. In addition, select gates 556/560 can be smaller in size than the larger, high voltage select gates 156/160 discussed above with respect to FIG. 1. This can provide savings in the total area of the die of approximately 1%, for example. Thus, according to various embodiments of the present disclosure, bit lines acting as shields during a read operation of adjacent bit lines are biased to the SRC line of the adjacent bit line being read. Source line bounce occurring as a result of the read operation of a selected bit line is thereby coupled onto the adjacent bitline acting as a shield. For example, odd bit lines $530_2$, $530_4$ act as shields during a read operation of their adjacent even numbered bit lines $530_1$, $530_3$. During the read operation, source line bounce can occur as discussed above. However, according to one or more embodiments, the source line bounce occurring as a result of the read operation is coupled onto the adjacent bit line acting as the shield. For example, during a read operation of even bit lines such as $530_3$, bit lines $530_2$ and $530_4$ are coupled to the SRC line 528 through their respective select gates $556_1$, $556_2$ which are controlled by the SGBL(ODD) signal 552. Thus, bit line BL1 $530_2$ and bit line BL3 $530_4$ act as shields with respect to bit line BL2 $530_3$ during a read operation of even bit lines, for example. During a read operation of odd bit lines, even bit lines BL0 $530_1$ and BL2 $530_3$ serve as shields for bit line BL1 $530_2$, for example.

Although FIG. 5 illustrates bit lines BL0-BL3 $530_1$-$530_4$ and their associated select gates $556_1$-$556_2$, $560_1$-$560_2$ coupled to one of two select signals SGBL(ODD) 552 and SGBL(EVEN) 554, various embodiments of the present disclosure are not so limited. For example, the grouping of bit lines is not limited to odd and even numbered bit lines. Although not shown in FIG. 5, additional embodiments might have bit lines grouped into three or more separate groups wherein each group of bit lines can be selectively coupled to the SRC line 528, for example. Similar to signal SGBL(ODD) 552 and signal SGBL(EVEN) 554 along with their respective select gates 556 and 560, one or more embodiments of the present disclosure might instead utilize a SGBL(ONE), SGBL(TWO) and SGBL(THREE) select signal along with associated select gates to selectively couple three independent groupings of bit lines to the SRC line 528, for example. It should be noted that many more bit lines, word lines and memory cells than are shown in FIG. 5 can be present in a memory device according to various embodiments of the present disclosure.

Figure 6:
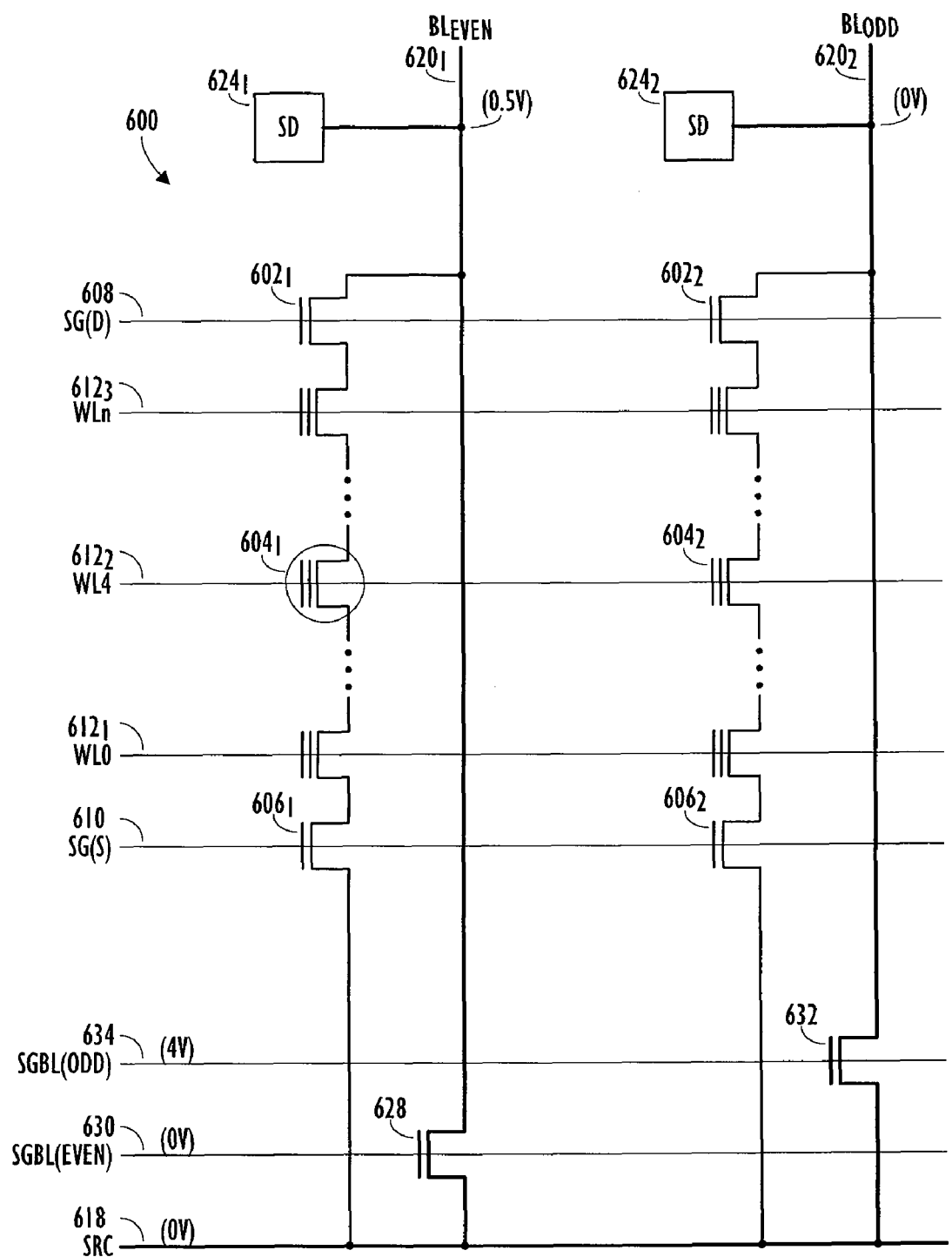
FIG. 6 shows an initial biasing condition of an array of memory cells undergoing a read operation according to an embodiment of the present disclosure.

FIG. 6 illustrates an initial biasing condition for a read or a verify operation of an array of memory cells 600 according to one or more embodiments of the present disclosure. FIG. 6 illustrates a single even bit line $620_1$ and a single odd bit line $620_2$. However, many more even and odd (e.g., alternating) bit lines are possible according to various embodiments of the present disclosure. FIG. 6 shows the initial biasing conditions to perform a read operation of even bit lines $620_1$ of an array 600, for example. The even bit line $620_1$ is pre-charged to 0.5V and the bias of the SRC line 618 is 0V, for example. Thus, the string VDS of the even string 620, shown in FIG. 6 is 0.5V. The SGBL(ODD) signal 634 is shown biased at 4V in order to enable (e.g., turn on) select gate 632 thereby selectively coupling the $BL_{ODD}$ $620_2$ bit line to the common SRC line 618. Following the establishment of these initial biasing conditions as shown in FIG. 6, the word line selected for reading (e.g., $612_2$) is biased to begin performing the read operation of the selected memory cell $604_1$, for example.

Figure 7:
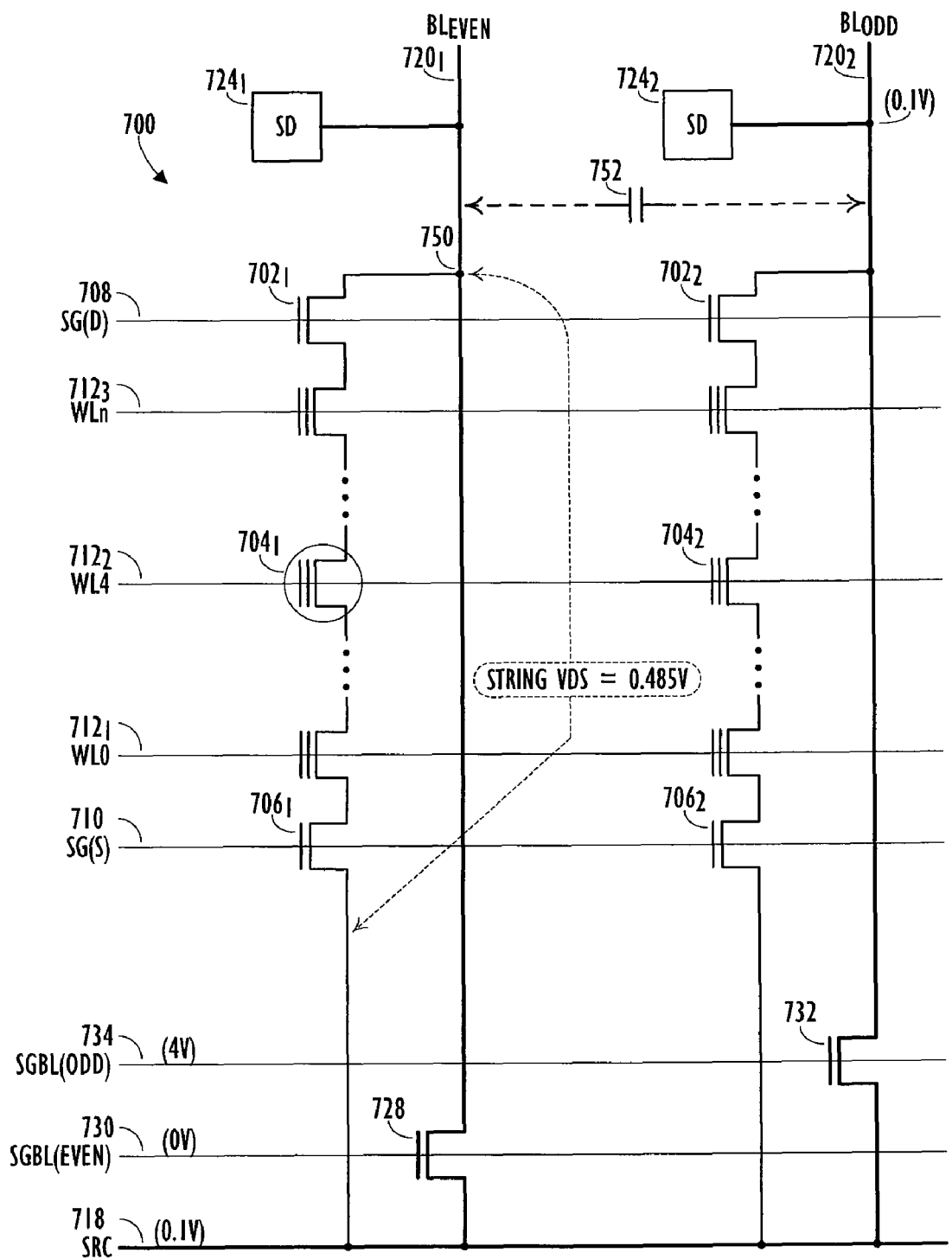
FIG. 7 shows a biasing condition of an array of memory cells undergoing a read operation according to an embodiment of the present disclosure.

FIG. 7 illustrates the same memory array as that shown in FIG. 6. However, FIG. 7 shows a possible biasing condition of the array as the selected memory cell $704_1$ is read. Although not shown in the Figure, many more memory cells of even bit lines and word line WL4 $712_2$ may be read concurrently with memory cell $704_1$. During the read operation of memory cell $704_1$, select gate 728 is disabled and select gate 732 is enabled. As part of the read operation, bit line $720_1$ is pre-charged to a particular voltage such as 0.5V (e.g., as shown in FIG. 6), for example. During the read operation of memory cell $704_1$, source line bounce of 0.1V is indicated in the Figure on the SRC line 718. As $BL_{EVEN}$ $720_1$ and $BL_{ODD}$ $720_2$ share a common SRC line 718 and select gate 732 is enabled, the 0.1V of source line bounce is coupled onto bit line $720_2$ as indicated in the Figure. A capacitive coupling effect 752 occurs between the even bit line $BL_{EVEN}$ $720_1$ and the odd bit line $BL_{ODD}$ $720_2$ serving as the shield for $BL_{EVEN}$ $720_1$. Thus, as indicated in FIG. 7, at least part of the source line bounce that was coupled onto the odd bit line is reflected onto the drain side of the string VDS of bit line $720_1$ (e.g., at and/or near node 750). This capacitive coupling effect 752 may result in a string VDS of 0.485V as indicated on bit line $720_1$, for example. Thus, according to one or more embodiments of the present disclosure, the effect of source line bounce has been reduced resulting in a string VDS read voltage (e.g., 0.485V) closer to the original pre-charge bias (e.g., 0.5V) thereby reducing read errors during the read operation. It should be noted that the various embodiments of the present disclosure are not limited to the biasing conditions illustrated in FIG. 7. Different source line bounce, pre-charge voltages and resulting effective read voltages (e.g., string VDS) are possible according to various embodiments of the present disclosure.

Figure 8:
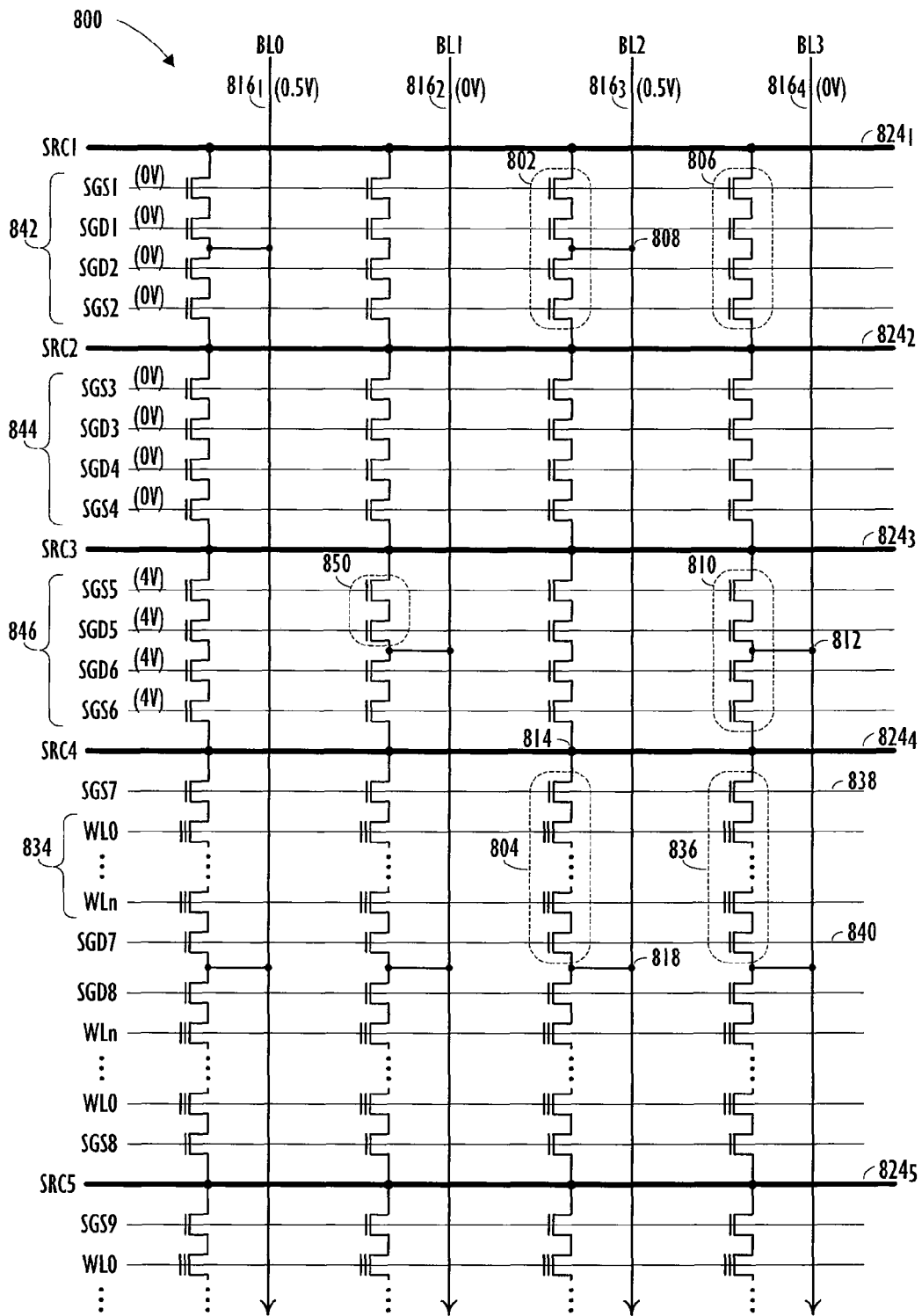
FIG. 8 shows an array of memory cells according to an embodiment of the present disclosure.

FIG. 8 illustrates another array of memory cells 800 according to various embodiments of the present disclosure. The array 800 comprises both select gates (e.g., drain, source) and non-volatile memory cells, such as flash memory cells, for example. The memory cells of array 800 are arranged in multiple blocks of memory having a NAND string configuration such as memory cells shown in string 804, for example. String 804 is shown coupled to n word lines (e.g., WL0-WLn) 834. Various embodiments may utilize NAND strings coupled to many word lines such as 8, 16 or 32 word lines per NAND string, for example. Each NAND string 804 of FIG. 8 and its associated word lines 834 and select lines 838, 840, are similar to those illustrated in FIG. 5. For example, string 804 can comprise a string such as the string of FIG. 5 comprising drain select gate 504 through source select gate 506. Signals 834 can comprise signals $512_8$-$512_1$, for example. Each NAND string of FIG. 8 (e.g., 804) is selectively coupled to a source line (e.g., $824_4$ at 814) and a bit line (e.g., $816_3$ at 818) as shown in the Figure, for example. Although not explicitly shown in the Figure, multiple source lines designated as SRC1-SRC5 $824_1$-$824_5$ illustrated in FIG. 8 are each coupled together. As such, a source line bounce experienced on one of the source lines SRC1-SRC5 $824_1$-$824_5$ is coupled to all of the source lines SRC1-SRC5 $824_1$-$824_5$. Sense devices, such as $538_1$-$538_4$ shown coupled to each bit line $530_1$-$530_4$ of FIG. 5 are not shown in FIG. 8 to improve the readability of the Figure.

Additional select gates, such as 802, 810 can serve as select gates $560_2$, $556_2$, respectively, for example. For example, select gates 802 serve to couple 808 the even numbered bit line BL2 $816_3$ to the SRC1 $824_1$ and SRC2 $824_2$ connections when odd numbered bit lines are being read. During a read operation on odd numbered bit lines, the select gates 810 are disabled while the select gates 802 are enabled (e.g., activated) to couple the even numbered bit lines to one or more source lines, such as SRC1 and SRC2, for example. During a read operation of even numbered bit lines (e.g., reading string 804), select gates 802 are disabled (e.g., deactivated) to uncouple the even bit line $816_3$ from a source line connection. Select gates 802 are disabled due to the 0V bias condition shown associated with signals 842 that are coupled to select gates 802. During a read operation of even numbered bit lines, select gates 810 are enabled (e.g., activated) to couple 812 the odd numbered bit lines to one or more source lines, such as SRC3 $824_3$ and SRC4 $824_4$, for example. Select gates 810 are enabled as shown in FIG. 8 by the 4V bias level associated with signals 846 which are coupled to gates 810. This repeats across the array of even numbered and odd numbered (e.g., alternate) bit lines of the array 800. It should be noted that various embodiments of the present disclosure are not limited to the biasing conditions as shown in FIG. 8. Although each string of select gates 802, 810 comprise four individual gates, various embodiments of the present disclosure are not so limited. Each pair of gates, such as 850, can be comprised of a single gate instead of two gates as shown in FIG. 8, for example. Further, there may be more or less of the strings of gates such as 806 and/or those gates shown coupled to signals 844. For example, these strings of gates (e.g., 806) might be included in a design to adjust for spacing issues in the circuit layout, for example.

Although references to read operations are described with respect to FIG. 8, various embodiments of the present disclosure are not limited to read operations performed but also apply to other memory device operations, such as performing verify operations, for example.

Various embodiments of the present disclosure are not limited to the arrangement and connections of select gates and memory cells as shown in FIG. 8. For example, the location in an array of the bit line coupling gates (e.g., those shown between SRC1 $824_1$ and SRC4 $824_4$) might vary according to various embodiments of the present disclosure. These gates and control signals might be located at either end of an array and/or may be present in the middle of an array, for example. The various embodiments also include multiple sets of these gates and control signals. For example, according to one or more embodiments, a group of these gates (e.g., gates shown between SRC1 $824_1$ and SRC4 $824_4$) may be located at one or both ends of the array with another group of gates located at some point in between, such as at a midpoint of the array, for example. Additionally, a memory device according to various embodiments of the present disclosure can have many more blocks of memory than those shown in FIG. 8. For example, each group of bit line coupling gates (e.g., gates shown between SRC1 $824_1$ and SRC4 $824_4$) may be utilized for multiple blocks of memory such as 512 blocks of memory, for example. As discussed with respect to FIGS. 5, 6 and 7, embodiments of the present disclosure such as shown in FIG. 8, provide for alternating bit lines to serve as shields to their adjacent bit lines during read operations and further provide for capacitive coupling between a bit line acting as a shield and an adjacent bit line in order to reduce the effects of source line bounce.

Figure 9:
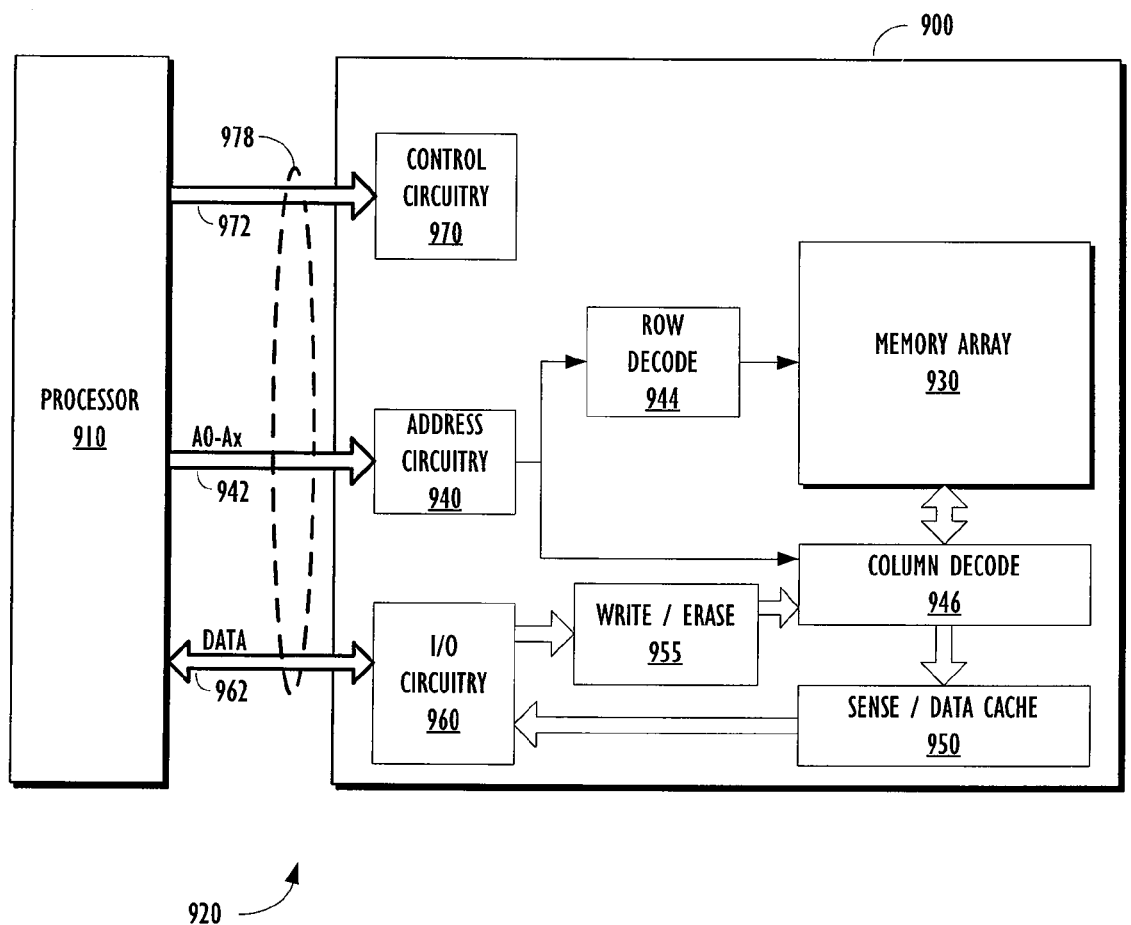
FIG. 9 shows a block diagram of a memory system that incorporates various embodiments of the present disclosure.

FIG. 9 is a functional block diagram of an electronic system having at least one memory device according to one or more embodiments of the present disclosure. The memory device 900 illustrated in FIG. 9 is coupled to a host such as a processor 910. The processor 910 may be a microprocessor or some other type of controlling circuitry. The memory device 900 and the processor 910 form part of an electronic system 920. The memory device 900 has been simplified to focus on features of the memory device that are helpful in understanding various embodiments of the present disclosure.

The memory device 900 includes one or more arrays of memory cells 930 that can be arranged in banks of rows and columns. Memory array 930 may comprise SLC and/or MLC memory, for example. According to one or more embodiments, the memory cells of memory array 930 are flash memory cells. The memory array 930 can consist of multiple banks and blocks of memory cells residing on a single or multiple die as part of the memory device 900. The memory cells of the memory array 930 may also be adaptable to store varying densities (e.g., MLC(four level) and MLC(eight level)) of data in each cell, for example.

An address buffer circuit 940 is provided to latch address signals provided on address input connections A0-Ax 942. Address signals are received and decoded by a row decoder 944 and a column decoder 946 to access the memory array 930. It will be appreciated by those skilled in the art, with the benefit of the present description, that the number of address input connections 942 depends on the density and architecture of the memory array 930. That is, the number of addresses increases with both increased memory cell counts and increased bank and block counts.

The memory device 900 reads data in the memory array 930 by sensing voltage or current changes in the memory array columns using sense/data cache circuitry 950. The sense/data cache circuitry 950, in at least one embodiment, is coupled to read and latch a row of data from the memory array 930. Sense devices 538 such as those discussed with respect to FIG. 5 can also comprise the sense/data cache circuitry 950, for example. Data input and output buffer circuitry 960 is included for bi-directional data communication over a plurality of data connections 962 with the processor 910. Write circuitry 955 is provided to write data to the memory array 930.

Control circuitry 970 is configured at least in part to implement various embodiments of the present disclosure, such as selectively enabling (e.g., driving) the bit line select gates 802, 810 to the source end of strings of memory cells 804/836, for example. In at least one embodiment, the control circuitry 970 may utilize a state machine. Control signals and commands can be sent by the processor 910 to the memory device 900 over the command bus 972. The command bus 972 may be a discrete signal or may be comprised of multiple signals, for example. These command signals 972 are used to control the operations on the memory array 930, including data read, data write (program), and erase operations. The command bus 972, address bus 942 and data bus 962 may all be combined or may be combined in part to form a number of standard interfaces 978. For example, the interface 978 between the memory device 900 and the processor 910 may be a Universal Serial Bus (USB) interface. The interface 978 may also be a standard interface used with many hard disk drives (e.g., SATA, PATA) as are known to those skilled in the art.

The electronic system illustrated in FIG. 9 has been simplified to facilitate a basic understanding of the features of the memory and is for purposes of illustration only. A more detailed understanding of internal circuitry and functions of non-volatile memories are known to those skilled in the art.

CONCLUSION

Various embodiments of the present disclosure provide methods for biasing signal levels in a memory device such as coupling unselected bit lines to a source line common to a source line selectively coupled to adjacent strings of memory cells, for example. Also disclosed are apparatus configured to perform the methods of various embodiments of the present disclosure. According to various embodiments of the present disclosure, a reduction in the effects of source line bounce during a read operation in a memory device can be realized.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of reading a target memory cell, comprising:
   selectively enabling a target memory cell in a string of memory cells in response to the data state of the target memory cell;
   coupling a first end of the string of memory cells to a first data line and coupling a second end of the string of memory cells to a source line;
   coupling a first end of a second string of memory cells to a second data line and coupling a second end of the second string of memory cells to the source line;
   enabling remaining memory cells of the string of memory cells;
   coupling the second data line to the source line; and
   reading the target memory cell.

2. The method of claim 1, further comprising:
   selectively enabling a second target memory cell in the second string of memory cells in response to the data state of the second target memory cell;
   enabling remaining memory cells of the second string of memory cells;
   decoupling the second data line from the source line; and
   coupling the first data line to the source line.

3. The method of claim 1, further comprising biasing the first data line.

4. The method of claim 1, wherein coupling the second data line to the source line comprises coupling a data line adjacent the first data line to the source line.

5. A method of operating an array of memory cells, comprising:
   coupling a first data line to a first end of a string of memory cells;
   coupling a second end of the string of memory cells to a source line;
   coupling a second data line to a first end of a second string of memory cells;
   coupling a second end of the second string of memory cells to the source line;
   coupling the second data line to the source line; and
   sensing a target memory cell of the string of memory cells.

6. The method of claim 5, wherein coupling the second data line to the source line comprises coupling a data line adjacent to the first data line to the source line.

7. The method of claim 5, wherein sensing the target memory cell comprises biasing the first data line.

8. A method of sensing in an array of memory cells, comprising:
   coupling a first plurality of alternating data lines to a source line;
   coupling a first plurality of strings of memory cells to the first plurality of alternating data lines;
   coupling a second plurality of strings of memory cells to a second plurality of alternating data lines, wherein the second plurality of alternating data lines are different than the first plurality of alternating data lines and wherein the second plurality of strings of memory cells are different than the first plurality of strings of memory cells;
   coupling the second plurality of strings of memory cells to the source line; and
   sensing a selected memory cell of each string of the second plurality of strings of memory cells.

9. The method of claim 8, wherein sensing a selected memory cell of each string of the second plurality of strings of memory cells further comprises sensing a selected memory cell of each string wherein each selected memory cell comprises a common row of memory cells.

10. The method of claim 8, wherein sensing a selected memory cell of each string of the second plurality of strings of memory cells further comprises biasing each of the second plurality of alternating data lines.

11. The method bf claim 8, further comprising coupling the first plurality of alternating data lines to a first end of the first plurality of strings of memory cells and coupling a second end of the first plurality of strings of memory cells to the source line.

12. A memory device, comprising:
at least one select gate configured to selectively couple a respective data line to a source line;
a plurality of memory cells arranged in logical rows and columns, each row of memory cells coupled to a respective access line, each column of memory cells selectively coupled at a first end of each column to the respective data line and each column selectively coupled at, a second end to the source line; and
control circuitry wherein the control circuitry is, configured to selectively enable one or more of the select gates, selectively bias each data line and selectively bias each access, line to one of a plurality of bias levels;
wherein the at least one select gate is configured to selectively couple its respective data line to the source line regardless of activation of any memory, cell of the plurality of memory cells.

13. The memory device, of claim 12, farther comprising a sense device selectively coupled to each data line wherein each of the sense devices is configured to detect a bias, voltage of a coupled data line.

14. The memory device of claim 12, wherein the control circuitry is further configured to selectively enable one or more of the select gates coupled to alternate data lines of the plurality of data lines.

15. The memory device of claim 12, wherein the control circuitry is further configured to perform a sense operation of a plurality of memory cells each coupled to a selected access line.

16. The memory device of claim 12, wherein each access line comprises a word line and each data line comprises a bit line.

17. The memory device of claim 12, further comprising a first select gate signal coupled to a first plurality of the one or more select gates and a second select gate signal coupled to a second plurality of the one or more select gates.

18. The memory device of claim 17, wherein the first plurality of select gates are coupled to alternate data lines different than data lines coupled to the second plurality of select gates.

19. The memory device of claim 17, wherein the control circuitry is further configured to independently enable the first select gate signal and the second select gate signal.

20. A memory device, comprising:
an array of memory cells arranged in logical rows and columns;
a first data line selectively coupled to a first end of a first column of memory cells wherein the first data line is coupled to at least one first select gate configured to selectively couple the first data line to a source line regardless of activation of any memory cell selectively coupled to the first data line;
a second data line selectively coupled to a first end of a second column of memory cells wherein the second data line is coupled to at least one second select gate configured to selectively couple the second data line to the source line regardless of activation of any memory cell selectively coupled to the second data line;
a plurality of access lines, each access line coupled to a respective row of memory cells; and
control circuitry, wherein the control circuitry is configured to, selectively enable the at least one first select, gate and/or the at least one second select gate;
wherein a second end of the first column of memory cells and a second end of the second column of memory cells are each selectively coupled to the source line.

21. The memory device of claim 20, wherein, each column of memory cells comprise a NAND configured string of flash memory cells.

22. The memory device of claim 20, wherein the memory cells are multilevel memory cells.

23. The memory device of claim 20, wherein the control circuitry is further configured to enable the at least one first select gate and perform a sense operation on a memory cell of the second column of memory cells.

24. The memory device of claim 20, wherein the control circuitry is further configured to selectively bias each data line to a particular bias voltage and selectively bias each of the plurality of access lines to one of a plurality of bias levels.

25. The memory device of claim 20, wherein the at least one first select gate comprises at least two first select gates and wherein the at least one second select gate comprises at least two second select gates.

26. The memory device of claim 20, wherein the control circuitry is further configured to interface with an external host coupled to the memory device, where the memory device and the host comprise an electronic system.

* * * * *

UNITED STATES PATENT AND TRADEMARK OFFICE
CERTIFICATE OF CORRECTION

| | | |
|---|---|---|
| PATENT NO. | : 8,134,868 B2 | Page 1 of 1 |
| APPLICATION NO. | : 12/265989 | |
| DATED | : March 13, 2012 | |
| INVENTOR(S) | : Uday Chandrasekhar | |

It is certified that error appears in the above-identified patent and that said Letters Patent is hereby corrected as shown below:

In column 10, line 66, in Claim 11, delete "bf" and insert -- of --, therefor.

In column 11, line 11, in Claim 12, delete "at," and insert -- at --, therefor.

In column 11, line 13, in Claim 12, delete "is," and insert -- is --, therefor.

In column 11, line 16, in Claim 12, delete "access," and insert -- access --, therefor.

In column 11, line 19, in Claim 12, delete "memory," and insert -- memory --, therefor.

In column 11, line 21, in Claim 13, delete "device," and insert -- device --, therefor.

In column 11, line 21, in Claim 13, delete "farther" and insert -- further --, therefor.

In column 11, line 23, in Claim 13, delete "bias," and insert -- bias --, therefor.

In column 12, line 19, in Claim 20, delete "to," and insert -- to --, therefor.

In column 12, line 19, in Claim 20, delete "select," and insert -- select --, therefor.

In column 12, line 24, in Claim 21, delete "wherein," and insert -- wherein --, therefor.

Signed and Sealed this
Eighth Day of May, 2012

David J. Kappos
*Director of the United States Patent and Trademark Office*